United States Patent
Hyun et al.

(10) Patent No.: US 11,316,520 B2
(45) Date of Patent: Apr. 26, 2022

(54) TRANSMITTER FOR TRANSMITTING MULTI-BIT DATA

(71) Applicants: SK hynix Inc., Icheon (KR); Seoul National University R&DB Foundation, Seoul (KR)

(72) Inventors: Changho Hyun, Seoul (KR); Suhwan Kim, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/164,627

(22) Filed: Feb. 1, 2021

(65) Prior Publication Data

US 2021/0367598 A1 Nov. 25, 2021

(30) Foreign Application Priority Data

May 25, 2020 (KR) .................. 10-2020-0062080

(51) Int. Cl.
| | |
|---|---|
| *H03K 17/16* | (2006.01) |
| *H03K 19/017* | (2006.01) |
| *H03K 19/17728* | (2020.01) |
| *H03K 19/173* | (2006.01) |
| *H03K 19/09* | (2006.01) |
| *H03K 19/0185* | (2006.01) |

(52) U.S. Cl.
CPC ............ *H03K 19/01742* (2013.01); *H03K 19/018557* (2013.01); *H03K 19/09* (2013.01); *H03K 19/1733* (2013.01); *H03K 19/17728* (2013.01)

(58) Field of Classification Search
CPC ..... H03K 19/01742; H03K 19/018557; H03K 19/09; H03K 19/1733; H03K 19/17728
See application file for complete search history.

(56) References Cited

U.S. PATENT DOCUMENTS

| | | | |
|---|---|---|---|
| 7,692,447 B2 * | 4/2010 | Cranford, Jr. ....... | H04L 25/0278 327/108 |
| 10,128,842 B1 | 11/2018 | Lin | |
| 10,277,441 B2 | 4/2019 | Hollis | |
| 2018/0053539 A1 * | 2/2018 | Shin ................. | G11C 7/1084 |
| 2019/0043543 A1 * | 2/2019 | Butterfield .......... | G11C 16/30 |
| 2019/0044762 A1 * | 2/2019 | Lin .................. | G11C 29/50008 |
| 2019/0044768 A1 * | 2/2019 | Kim ..................... | H03K 7/02 |

(Continued)

OTHER PUBLICATIONS

Changho Hyun et al., "A 20Gb/s Dual-Mode PAM4/NRZ Single-Ended Transmitter with RLM Compensation," 2019 IEEE International Symposium on Circuits and Systems (ISCAS), 2019, pp. 1-4, Sapporo, Japan, doi: 10.1109/ISCAS.2019.8702456.

*Primary Examiner* — Kurtis R Bahr

(57) ABSTRACT

A transmitter includes a driving circuitry configured to drive a channel coupled to an output node by controlling an output impedance of a pull-up path, an output impedance of a pull-down path, or both, according to one or more multi-bit data signals, a pull-up control signal, and a pull-down control signal; a driving control circuit configured to generate the pull-up control signal and the pull-down control signal according to one or more calibration signals and the multi-bit data signals or according to the calibration signals and one or more duplicate multi-bit data signals, the duplicate multi-bit data signals duplicating the multi-bit data signals; and a look-up table storing values of the calibration signals.

17 Claims, 15 Drawing Sheets

(56) References Cited

U.S. PATENT DOCUMENTS

2019/0215199 A1 7/2019 Hollis et al.
2019/0215202 A1 7/2019 Hollis
2019/0394071 A1* 12/2019 Farzan ................ H04L 25/0282

* cited by examiner

FIG. 11

| PU0<0> | PU0<1> | PU0<2> | PU0<3> | PU0<4> |
| PU1<0> | PU1<1> | PU1<2> | PU1<3> | PU1<4> |
| PU2<0> | PU2<1> | PU2<2> | PU2<3> | PU2<4> |
| PU3<0> | PU3<1> | PU3<2> | PU3<3> | PU3<4> |
| PD0<0> | PD0<1> | PD0<2> | PD0<3> | PD0<4> |
| PD1<0> | PD1<1> | PD1<2> | PD1<3> | PD1<4> |
| PD2<0> | PD2<1> | PD2<2> | PD2<3> | PD2<4> |
| PD3<0> | PD3<1> | PD3<2> | PD3<3> | PD3<4> |

*400*

TRANSMITTER FOR TRANSMITTING MULTI-BIT DATA

CROSS-REFERENCE TO RELATED APPLICATION

The present application claims priority under 35 U.S.C. § 119(a) to Korean Patent Application No. 10-2020-0062080, filed on May 25, 2020, which are incorporated herein by reference in its entirety.

BACKGROUND

1. Technical Field

Various embodiments may relate to a transmitter for transmitting multi-bit data.

2. Related Art

In order to transmit data at a high speed, multi-bit data is transmitted.

For example, a four-level pulse amplitude modulation (PAM-4) signal is a multi-level signal having four levels corresponding to 2-bit data.

FIG. 1 includes eye diagrams showing a comparison of the PAM-2 signal and the PAM-4 signal.

The PAM-2 signal is a binary signal having two levels with a wide gap between the levels.

However, multi-level signals such as PAM-4 signal are vulnerable to noise because the gap between adjacent levels in the vertical direction (here, the differences in voltage levels) is narrower than that of a PAM-2 signal.

FIG. 2 illustrates a phenomenon in which the impedance of a termination resistor (here, a resistor formed using an on resistance of a MOSFET) of a receiver depends on the magnitude of the output voltage.

When transmitting multi-bit data, output voltage varies depending on the data, and as a result, the impedance of the termination resistor depends on the data.

As a result, the signal levels may not be evenly arranged in the eye diagram, thereby degrading the linearity of the transmitter. Referring to the eye diagram shown in FIG. 2, a first gap between a first pair of adjacent levels (e.g., "11" and "10") may be narrower than a second gap between a second pair of adjacent levels (e.g., "01" and "00"), leading to deterioration of the linearity of the transmitter.

SUMMARY

In accordance with an embodiment of the present disclosure, a transmitter may include a driving circuitry configured to drive a channel coupled to an output node by controlling an output impedance of a pull-up path, an output impedance of a pull-down path, or both, according to a multi-bit data signals, a pull-up control signal, and a pull-down control signal; a driving control circuit configured to generate the pull-up control signal and the pull-down control signal according to one or more calibration signals and the multi-bit data signals or according to the calibration signals and one or more duplicate multi-bit data signals, the duplicate multi-bit data signals duplicating the multi-bit data signals; and a look-up table storing values of the calibration signals.

In accordance with an embodiment of the present disclosure, a transmitter may include a driving circuitry configured to drive a channel coupled to an output node by controlling an output impedance of a pull-up path, an output impedance of a pull-down path, or both, according to one or more multi-bit data signals, a pull-up control signal, and a pull-down control signal; a driving control circuit configured to generate the pull-up control signal and the pull-down control signal according to one or more calibration signals and one or more du duplicate multi-bit data signals, the duplicate multi-bit data signals duplicating the multi-bit data signals; a data conversion circuit configured to generate parallel data from input data; and a serialization circuitry configured to generate the multi-bit data signals and the duplicate multi-bit data signals by serializing the parallel data.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and beneficial aspects of those embodiments.

FIG. 11 is a look-up table according to an embodiment of the present disclosure.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 1:
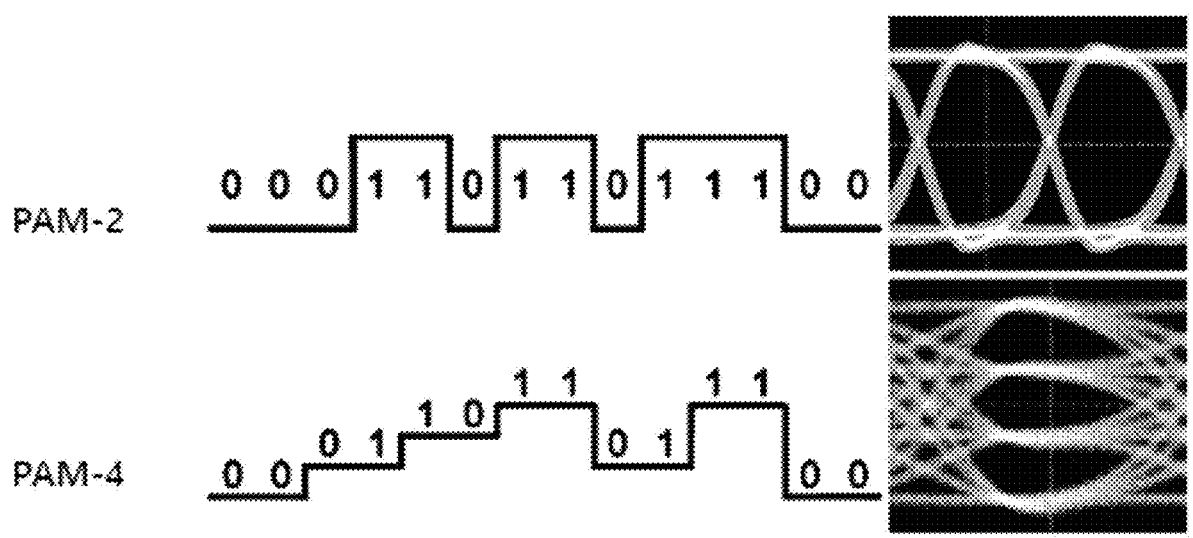
FIG. 1 illustrates a PAM-2 signal and a PAM-4 signal.
Figure 2:
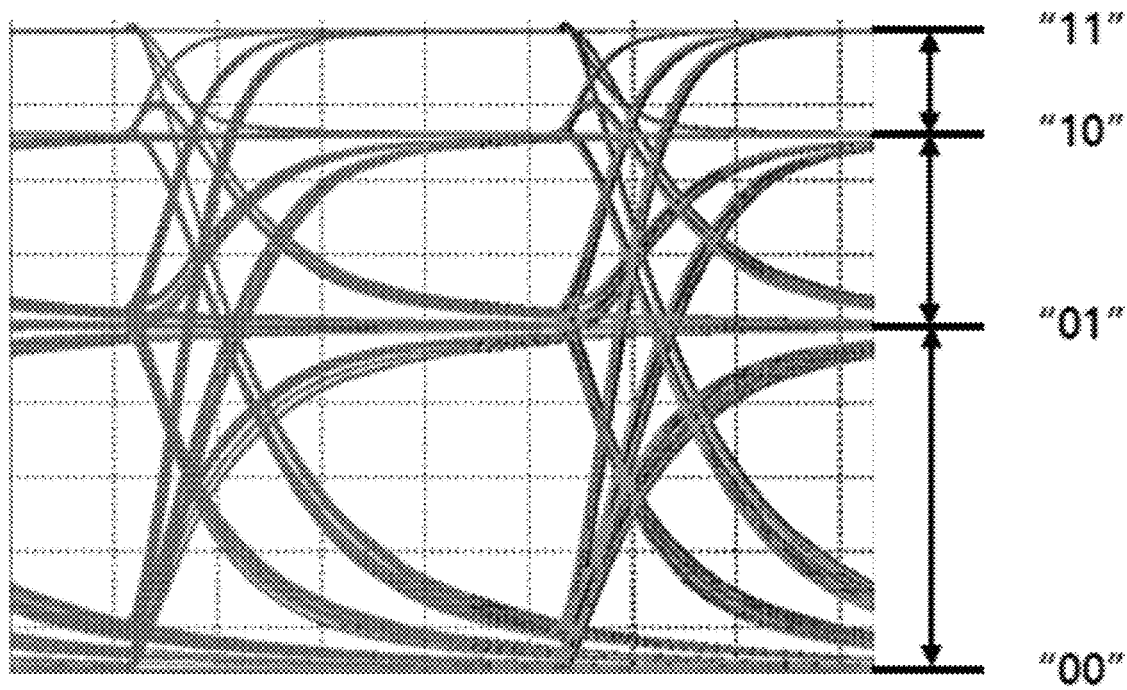
FIG. 2 is a graph showing a relation between an output voltage and impedance of a termination resistor.
Figure 3:
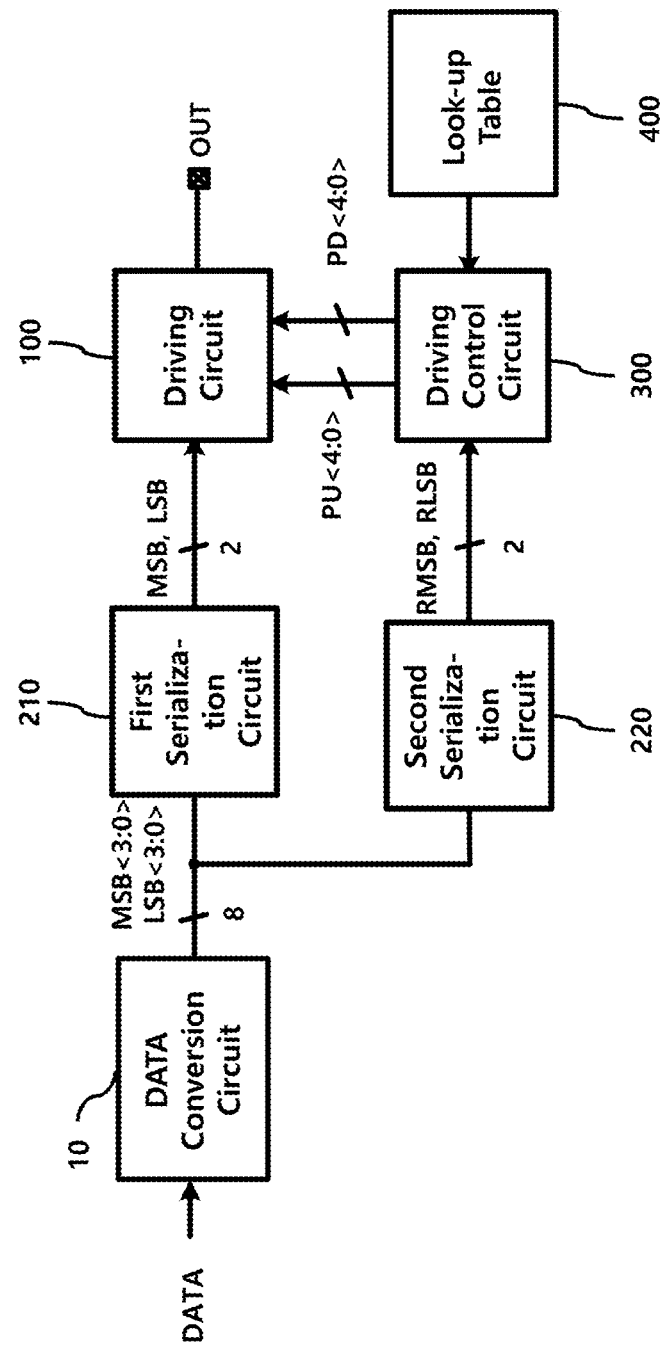
FIG. 3 is a block diagram of a transmitter according to an embodiment of the present disclosure.

FIG. 3 is a block diagram of a transmitter according to an embodiment of the present disclosure.

The transmitter according to an embodiment of the present disclosure includes a data conversion circuit 10, a serialization circuitry 250, a driving circuit 100, a driving control circuit 300, and a look-up table 400. The serialization circuitry 250 includes a first serialization circuit 210 and a second serialization circuit 220.

The data conversion circuit 10 converts input data DATA into data having a predetermined form.

In this embodiment of FIG. 3, the data conversion circuit 10 receives 8-bit parallel data DATA and converts it into 4-bit upper parallel data MSB<3:0> and 4-bit lower parallel data LSB<3:0>.

Figure 4A:
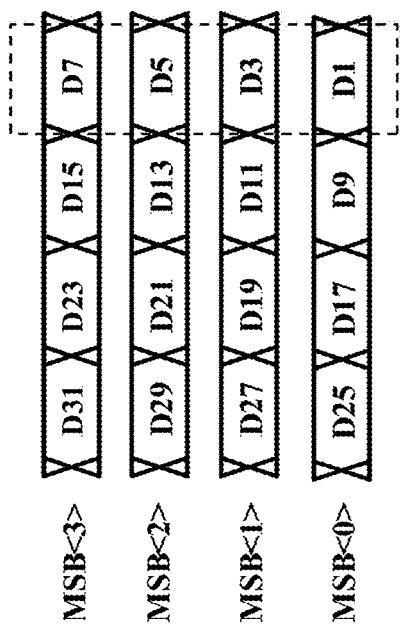
FIGS. 4A and 4B illustrate an operation of a data conversion circuit according to an embodiment of the present disclosure.
Figure 4B:
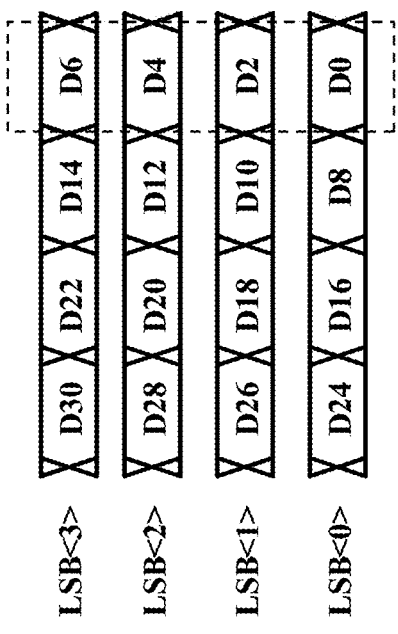

FIGS. 4A and 4B each illustrate an operation of a data conversion circuit (e.g., the data conversion circuit 10 of FIG. 3) according to an embodiment of the present disclosure.

FIG. 4A shows the structure of upper parallel data, and FIG. 4B shows the structure of lower parallel data.

A dotted box in FIG. 4A represents 4-bit upper parallel data MSB<3:0> and a dotted box in FIG. 4B represents 4-bit lower parallel data LSB<3:0>, which are generated using 8-bit parallel data from D0 to D7.

From bit 0 to bit 3 of the lower parallel data LSB<3:0> correspond to four data D0, D2, D4, and D6.

From bit 0 to bit 3 of the upper parallel data MSB<3:0> correspond to four data D1, D3, D5, and D7.

Using 8 parallel data from D8 to D15, 8 parallel data from D16 to D23, and 8 parallel data from D24 to D31, corresponding upper and lower parallel data can be generated in the same way.

Returning to FIG. 3, the first serialization circuit 210 serializes the upper parallel data MSB<3:0> and the lower parallel data LSB<3:0> to generate the upper bit signal MSB and the lower bit signal LSB, and the second serialization circuit 220 serializes the upper parallel data MSB<3:0> and the lower parallel data LSB<3:0> to generate a duplicate upper bit signal RMSB and a duplicate lower bit signal RLSB.

Figure 5:
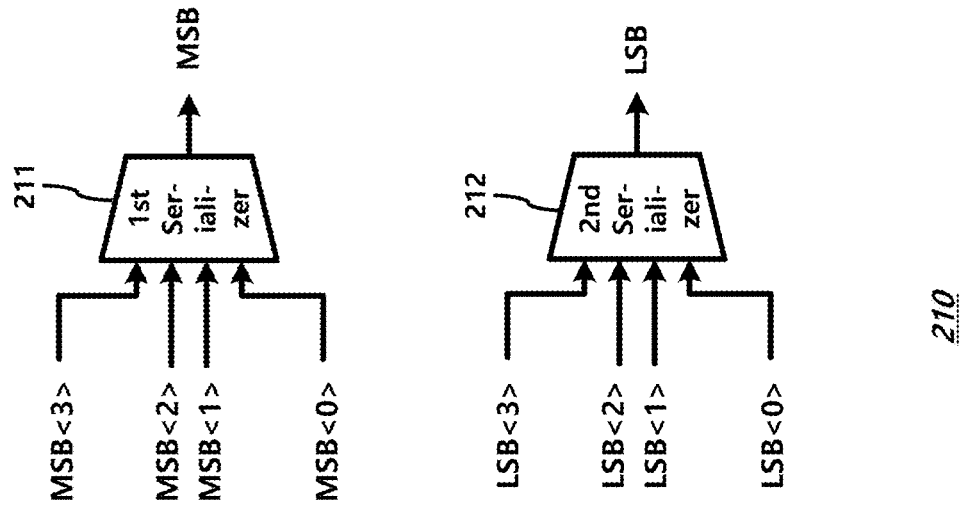
FIG. 5 is a block diagram of a first serialization circuit according to an embodiment of the present disclosure.

FIG. 5 is a block diagram of a first serialization circuit 210 suitable for use as the first serialization circuit 210 in FIG. 3) according to an embodiment of the present disclosure.

The first serialization circuit 210 in FIG. 5 includes a first serializer 211 and a second serializer 212.

The first serializer 211 serializes the upper parallel data MSB<3:0> to output the upper bit signal MSB, and the second serializer 212 serializes the lower parallel data LSB<3:0> to output the lower bit signal LSB.

Referring to FIGS. 4A and 4B, for example, pairs of upper bit signals MSB and lower bit signals LSB output from the first serialization circuit 210 are (D1, D0), (D3, D2), (D5, D4), and (D7, D6). Specifically, a first pair of the upper and lower bit signals MSB and LSB may indicate a first pair of data D1 and D0, respectively, a second pair of the upper bit and lower bit signals MSB and LSB may indicate a second pair of data D3 and D2, respectively, and so on.

Figure 6:
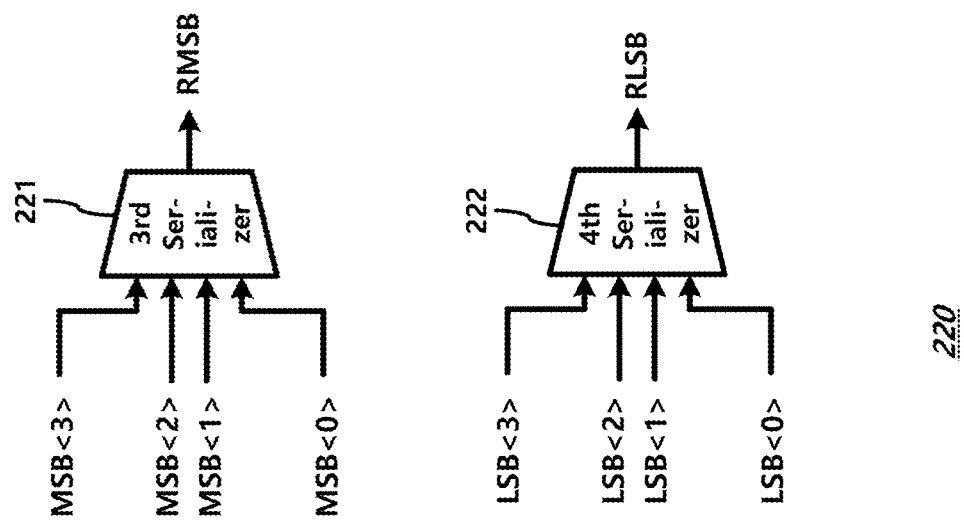
FIG. 6 is a block diagram of a second serialization circuit according to an embodiment of the present disclosure.

FIG. 6 is a block diagram of a second serialization circuit 220 suitable for use as the second serialization circuit 220 in FIG. 3 according to an embodiment of the present disclosure.

The second serialization circuit 220 in FIG. 6 includes a third serializer 221 and a fourth serializer 222.

The third serializer 221 serializes the upper parallel data MSB<3:0> and outputs a duplicate upper bit signal RMSB, and the fourth serializer 222 serializes the lower parallel data LSB<3:0> to output a duplicate lower bit signal RLSB.

Referring to FIGS. 4A and 4B, for example, pairs of duplicate upper bit signals RMSB and duplicate lower bit signals RLSB output from the first serialization circuit 210 are (D1, D0), (D3, D2), (D5, D4), and (D7, D6). Specifically, a first pair of the duplicate upper and lower bit signals RMSB and RLSB may indicate a first pair of data D1 and D0, respectively, a second pair of the duplicate upper bit and lower bit signals RMSB and RLSB may indicate a second pair of data D3 and D2, respectively, and so on.

The duplicate upper bit signal RMSB is a signal that duplicates the upper bit signal MSB, and the duplicate lower bit signal RLSB is a signal that duplicates the lower bit signal LSB.

Figure 7:
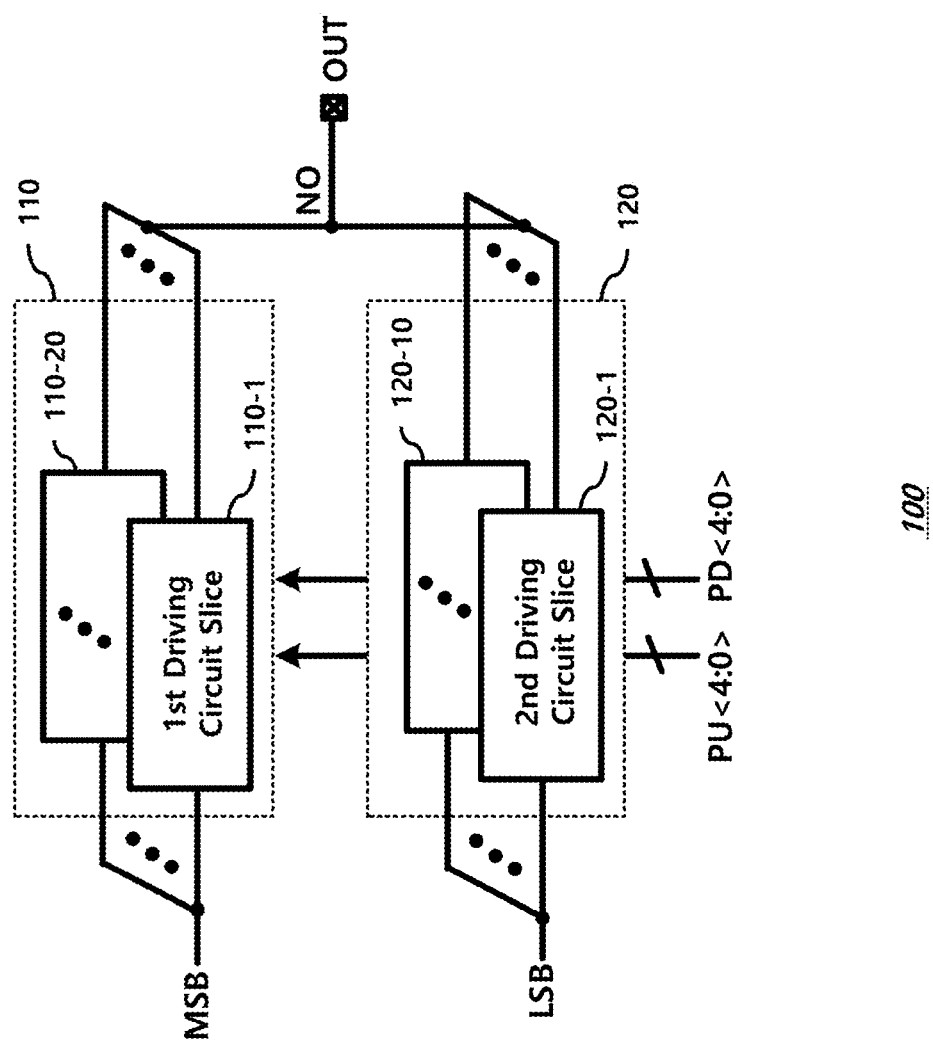
FIG. 7 is a block diagram of a driving circuit according to an embodiment of the present disclosure.

FIG. 7 is a block diagram of a driving circuit (or a driving circuitry) suitable for use as the driving circuit 100 in FIG. 3 according to an embodiment of the present disclosure.

The driving circuit 100 in FIG. 7 drives a channel coupled to an output node NO.

The driving circuit 100 according to an embodiment of the present disclosure includes a first driving circuit 110 and a second driving circuit 120. In an embodiment, the driving circuit 100 may control a first output impedance of a pull-up path, or a second output impedance of a pull-down path, or both, according to one or more multi-bit data signals (e.g., the upper bit signal MSB and the lower bit signal LSB in FIG. 3), a pull-up control signal (e.g., the pull-up control signal PU<4:0> in FIG. 3), and a pull-down control signal (e.g., the pull-down control signal PD<4:0> in FIG. 3). For example, the pull-up path may include equivalent resistors (e.g., equivalent resistors R11 and R21 in FIGS. 12 to 15) of the first driving circuit 110 and the second driving circuit 120, and the pull-down path may include equivalent resistors (e.g., equivalent resistors R12 and R22 in FIGS. 12 to 15) of the first driving circuit 110 and the second driving circuit 120.

The first driving circuit 110 drives the channel according to the upper bit signal MSB to provide an output signal OUT, and the second driving circuit 120 drives the channel according to the lower bit signal LSB to provide the output signal OUT.

The outputs of the first driving circuit 110 and the second driving circuit 120 are commonly coupled at the output node NO.

The output impedance of the first driving circuit 110 and the second driving circuit 120 is controlled according to the pull-up control signal PU and the pull-down control signal PD. For example, the output impedance of the first driving circuit 110 may be controlled according to the pull-up control signal PU and the pull-down control signal PD, and the output impedance of the second driving circuit 120 may be controlled according to the pull-up control signal PU and the pull-down control signal PD.

The first driving circuit 110 has the same structure and includes a plurality of first driving circuit slices 110-1 to 110-20 coupled in parallel with each other, and the second driving circuit 120 has the same structure and is parallel to each other and includes a plurality of second driving circuit slices 120-1 to 120-10 coupled in parallel to each other. For example, the first driving circuit 110 may include a plurality of first driving circuit slices 110-1 to 110-20 coupled in parallel with each other, the plurality of first driving circuit slices 110-1 to 110-20 each having substantially the same structure, and the second driving circuit 120 may include a plurality of second driving circuit slices 120-1 to 120-10 coupled in parallel to each other, the plurality of second driving circuit slices 120-1 to 120-10 each having substantially the same structure.

In this embodiment of FIG. 7, the number of first driving circuit slices 110-1 to 110-20 is 20 and number of second driving circuit slices 120-1 to 120-10 is 10, but the number of each may vary according to embodiments.

Figure 8:
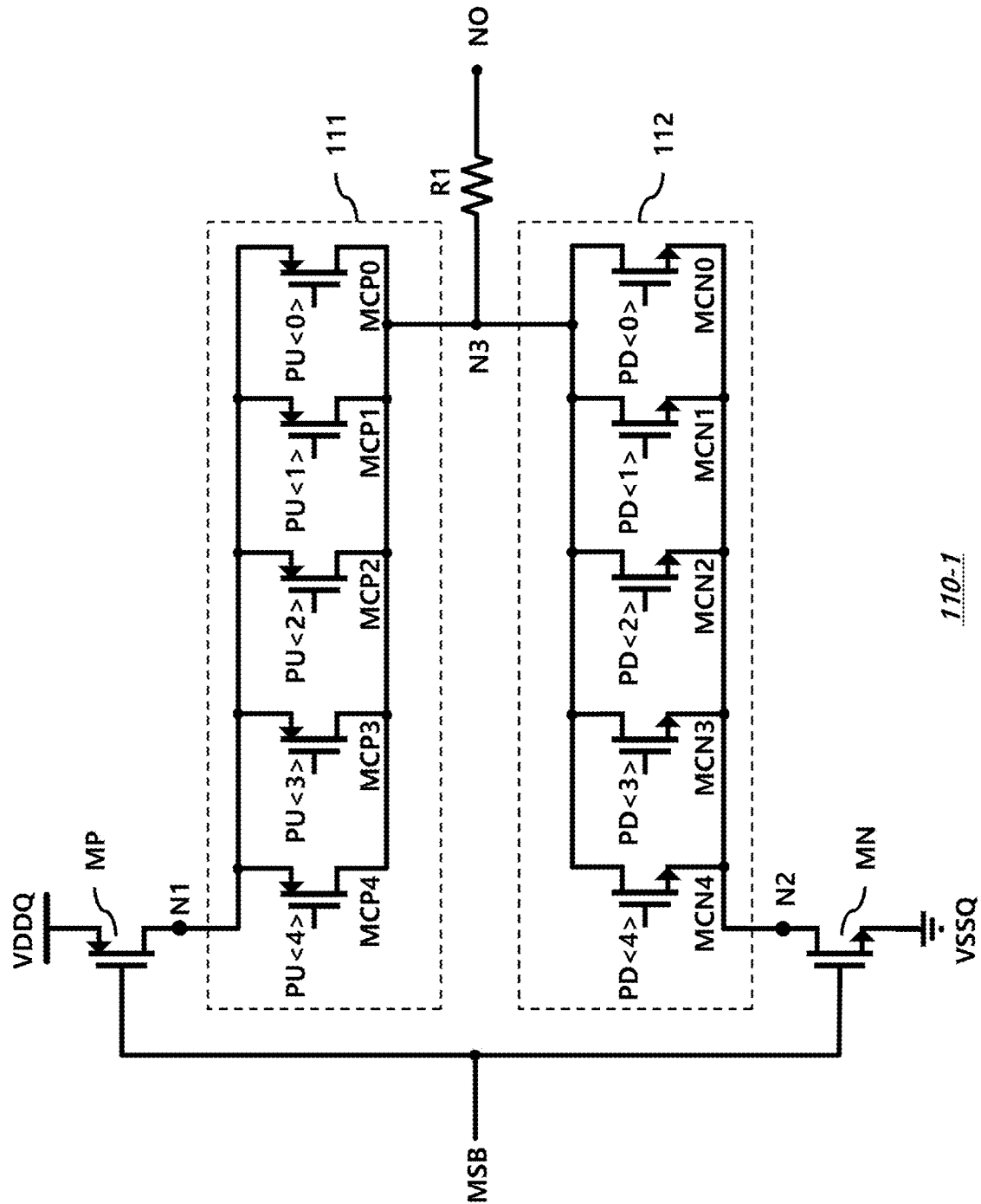
FIG. 8 is a circuit diagram of a first driving circuit slice according to an embodiment of the present disclosure.

FIG. 8 is a circuit diagram of a first driving circuit slice 110-1 suitable for used as the driving circuit slice 110-1 in FIG. 7 according to an embodiment of the present disclosure.

The first driving circuit slice 110-1 in FIG. 8 includes a first PMOS transistor MP and a first NMOS transistor MN to which an upper bit signal MSB is applied to gates thereof.

The source of the first PMOS transistor MP is coupled to the first power source VDDQ and the drain is coupled to a first node N1.

The source of the first NMOS transistor MN is coupled to the second power source VSSQ and the drain is coupled to a second node N2.

The first driving circuit slice 110-1 further includes a first adjustment circuit 111 and a second adjustment circuit 112.

The first adjustment circuit 111 is coupled between the first node N1 and a third node N3, and the second adjustment circuit 112 is coupled between the second node N2 and the third node N3.

The first adjustment circuit 111 includes a plurality of PMOS transistors MCP0 to MCP4 coupled in parallel between the first node N1 and the third node N3, and a plurality of pull-up control bit signals PU<0> to PU<4> indicating bits of the pull-up control signal PU<4:0> are applied to gates of the plurality of PMOS transistors MCP0 to MCP4, respectively.

The second adjustment circuit 112 includes a plurality of NMOS transistors MCN0 to MCN4 coupled in parallel between the second node N2 and the third node N3, and a plurality of pull-down control bit signals PD<0> to PD<4> indicating bits of the pull-down control signal PD<4:0> are applied to gates of the plurality of NMOS transistors MCN0 to MCN4, respectively.

The pull-up control signal PU<4:0> adjusts the impedance between the first node N1 and the second node N3, and the pull-down control signal PD<4:0> adjusts the impedance between the second node N2 and the third node N3.

That is, the first driving circuit slice 110-1 drives the channel coupled to the output node NO according to the upper bit signal MSB, but the output impedance at the output node NO may be controlled according to the pull-up control signal PU<4:0> and the pull-down control signal PD<4:0>.

The first driving circuit slice 110-1 may further include a first resistor R1 coupled between the third node N3 and the output node NO.

If the first resistor R1 is further included, the linearity of the output impedance of the first driving circuit slice 110-1 may be substantially prevented from deteriorating according to the change of the pull-up control signal PU<4:0> and the pull-down control signal PD<4:0>.

Figure 9:
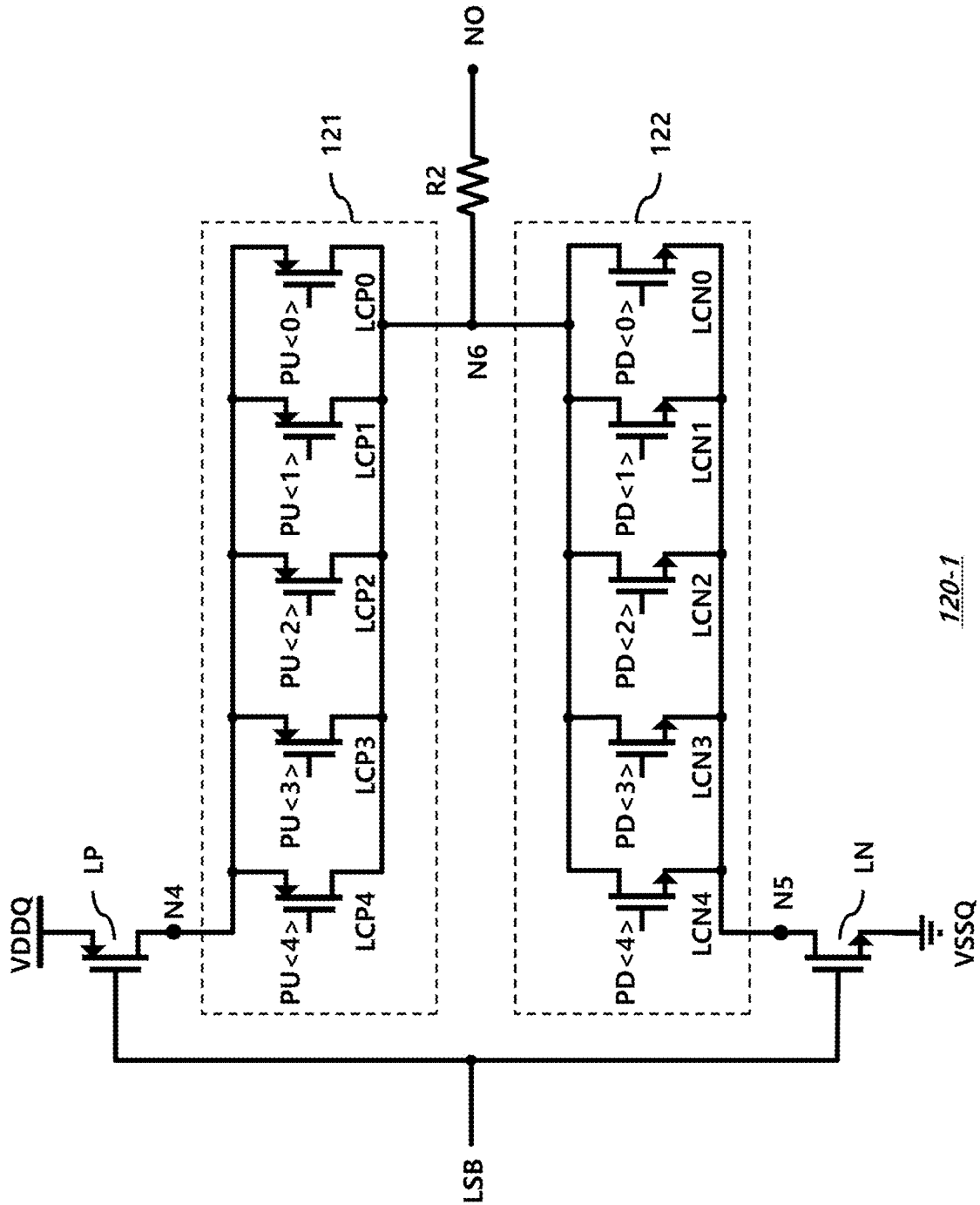
FIG. 9 is a circuit diagram of a second driving circuit slice according to an embodiment of the present disclosure.

FIG. 9 is a circuit diagram of a second driving circuit slice 120-1 suitable for used as the driving circuit slice 120-1 in FIG. 7 according to an embodiment of the present disclosure.

The second driving circuit slice 120-1 in FIG. 9 includes a second PMOS transistor LP and a second NMOS transistor LN to which a lower bit signal LSB is applied to gates thereof.

The source of the second PMOS transistor LP is coupled to the first power source VDDQ and the drain is coupled to a fourth node N4.

The source of the second NMOS transistor LN is coupled to the second power source VSSQ and the drain is coupled to a fifth node N5.

The second driving circuit slice 120-1 further includes a third adjustment circuit 121 and a fourth adjustment circuit 122.

The third adjustment circuit 121 is coupled between the fourth node N4 and a sixth node N6, and the fourth adjustment circuit 122 is coupled between the fifth node N5 and the sixth node N6.

The third adjustment circuit 121 includes a plurality of PMOS transistors LCP0 to LCP4 coupled in parallel between the fourth node N4 and the sixth node N6, and a plurality of pull-up control bit signals PU<0> to PU<4> indicating bits of the pull-up control signal PU<4:0> are applied to gates of the plurality of PMOS transistors LCP0 to LCP4, respectively.

The fourth adjustment circuit 122 includes a plurality of NMOS transistors LCN0 to LCN4 coupled in parallel between the fifth node N5 and the sixth node N6, and a plurality of pull-down control bit signals PD<0> to PD<4> indicating bits of the pull-down control signal PD<4:0> are applied to gates of the plurality of NMOS transistors LCN0 to LCN4, respectively.

The pull-up control signal PU<4:0> adjusts the resistance between the fourth node N4 and the sixth node N6, and the pull-down control signal PD<4:0> adjusts the impedance between the fifth node N5 and the sixth node N6.

That is, the second driving circuit slice 120-1 drives the channel coupled to the output node NO according to the lower bit signal LSB, but the output impedance at the output node NO may be controlled according to the pull-up control signal PU<4:0> and the pull-down control signal PD<4:0>.

The second driving circuit slice 120-1 may further include a second resistor R2 between the sixth node N6 and the output node NO.

When the second resistor R2 is further included, the linearity of the output impedance of the second driving circuit 120 may be substantially suppressed from deteriorating according to changes in the pull-up control signal PU<4:0> and the pull-down control signal PD<4:0>.

Referring back to FIG. 7, the outputs of the first driving circuit slices 110-1 to 110-20 and the second driving circuit slices 120-1 to 120-10 are commonly coupled to the output node NO.

The level of the output signal OUT provided from the driving circuit 100 is determined according to the upper bit signal MSB and the lower bit signal LSB.

At this time, the level of the output signal OUT is adjusted according to the pull-up control signal PU<4:0> and the pull-down control signal PD<4:0>, so that intervals between adjacent levels of the output signal OUT may be set to be substantially constant. More specifically, when the output signal OUT has first, second, third, and fourth levels in ascending order, a first interval between the first and second levels may be substantially equal to a second interval between the second and third levels as well as a third interval between the third and fourth levels. For example, a level separation mismatch ratio (RLM) of the output signal OUT may be equal to or greater than 0.95, 0.97, or 0.99.

Returning to FIG. 3, the driving control circuit 300 may generate the pull-up control signal PU<4:0> and the pull-down control signal PD<4:0> according to one or more calibration signals from the look-up table 400 and one or more duplicate multi-bit data signals RMSB and RLSB. For example, the driving control circuit 300 refers to the look-up table 400 according to the duplicate upper bit signal RMSB and the duplicate lower bit signal RLSB, and provides the pull-up control signal PU<4:0> and the pull-down control signal PD<4:0>.

The duplicate upper bit signal RMSB and the duplicate lower bit signal RLSB are signals that are substantially the same as the upper bit signal MSB and the lower bit signal LSB.

Accordingly, the driving control circuit 300 may receive the upper bit signal MSB and the lower bit signal LSB instead of the duplicate upper bit signal RMSB and the duplicate lower bit signal RLSB. Thus, in an embodiment, the second serialization circuit 220 generating the duplicate upper bit signal RMSB and the duplicate lower bit signal RLSB may be omitted, thereby reducing the circuit area and power consumption of the driving control circuit 300.

However, in this case, deterioration may occur in the upper bit signal MSB and the lower bit signal LSB provided to the driving circuit 100 due to the loading effect.

When deterioration occurs in a signal, it may be beneficial to use the duplicate upper bit signal RMSB and the duplicate lower bit signal RLSB that duplicate the upper bit signal MSB and the lower bit signal LSB, respectively, in the driving control circuit 300.

Figure 10:
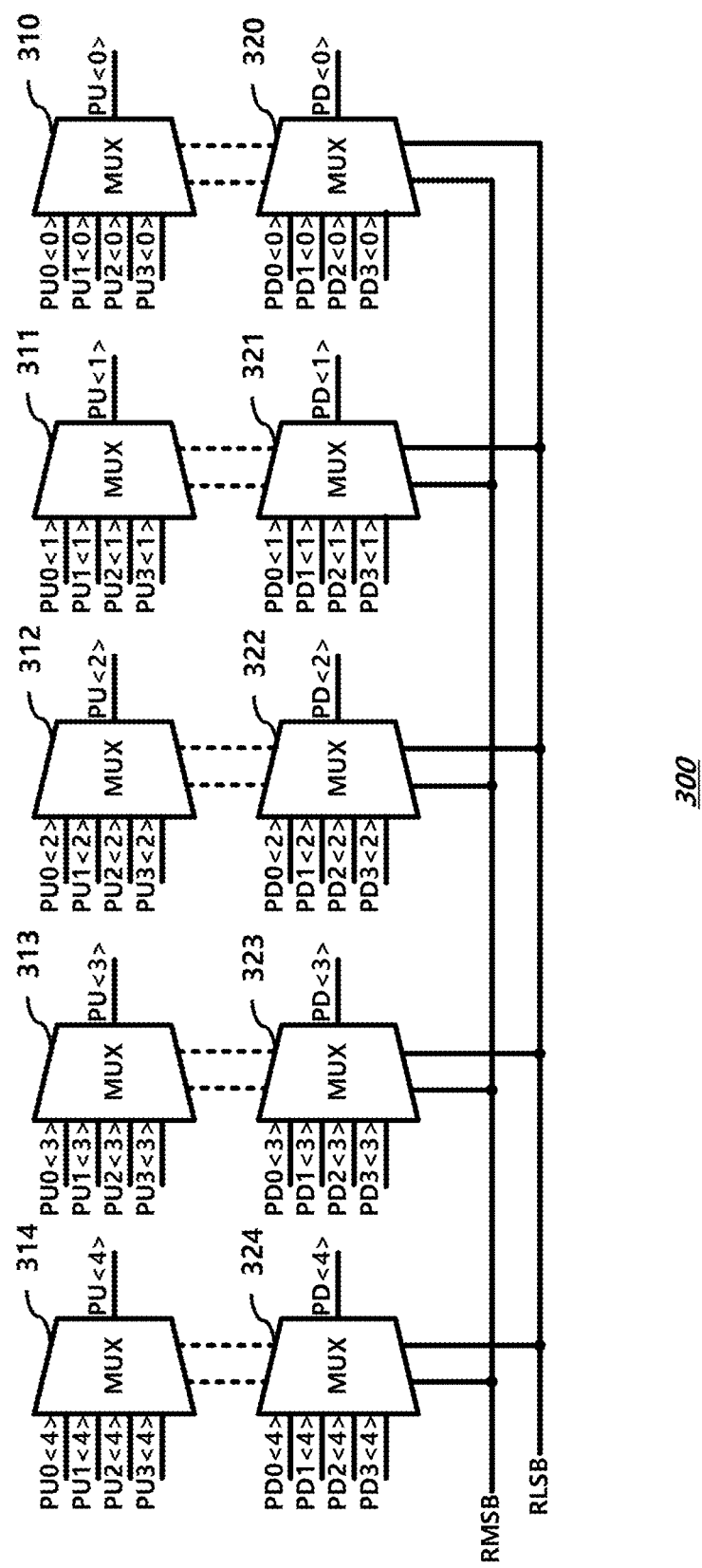
FIG. 10 is a circuit diagram of a driving control circuit according to an embodiment of the present disclosure.

FIG. 10 is a circuit diagram of a driving control circuit 300 suitable for use as the driving control circuit 300 in FIG. 3 according to an embodiment of the present disclosure.

The driving control circuit 300 in FIG. 10 includes a plurality of first selection circuits 310 to 314 and a plurality of second selection circuits 320 to 324 outputting the pull-up control signal PU<4:0> and the pull-down control signal PD<4:0>. For example, the plurality of first selection circuits 310 to 314 may output a plurality of pull-up control bit signals PU<0> to PU<4>, respectively, and the plurality of second selection circuits 320 to 324 may output a plurality of pull-down control bit signals PD<0> to PD<4>, respectively.

Each of the plurality of first selection circuits 310 to 314 and the plurality of second selection circuits 320 to 324 selects and outputs one of a plurality of signals provided from a look-up table (e.g., the look-up table 400 in FIG. 3) according to the duplicate upper bit signal RMSB and the duplicate lower bit signal RLSB.

For example, the first selection circuit 310 receives four signals PU0<0>, PU1<0>, PU2<0>, and PU3<0> provided from the look-up table 400 and outputs a bit 0 signal (or a first pull-up control bit signal) PU<0> of the pull-up control signal PU<4:0> according to the duplicate upper bit signal RMSB and the duplicate lower bit signal RLSB.

The remaining first selection circuits 311 to 314 and the second selection circuits 320 to 324 operate in a similar manner to generate signals of corresponding bits of the pull-up control signal PU<4:0> and the pull-down control signal PD<4:0>.

FIG. 11 is a look-up table 400 suitable for use as the look-up table 400 in FIG. 3 according to an embodiment of the present disclosure.

The look-up table 400 in FIG. 11 stores values of signals PU0<0> to PD3<4> provided as inputs of the plurality of first selection circuits 310 to 314 and the plurality of second selection circuits 320 to 324 of the driving control circuit 300 as shown in FIG. 10.

Signals PU0<0> to PD3<4> that have values stored in the look-up table 400 and are provided as inputs of the plurality of first selection circuits 310 to 314 and second selection circuits 320 to 324 may be referred to as calibration signals.

Values of the calibration signals PU0<0> to PD3<4> stored in the look-up table 400 may be determined through a calibration operation.

FIGS. 12, 13, 14, and 15 illustrate calibration operations according to an embodiment of the present disclosure.

In each of FIGS. 12 to 15, the box on the left corresponds to the first driving circuit 110, and the box on the right corresponds to the second driving circuit 120.

As described above, the first driving circuit 110 and the second driving circuit 120 are commonly coupled to the output node NO.

Among the resistors in the left box, the resistance coupled to the first power supply VDDQ corresponds to the output impedance when the first PMOS transistor MP of FIG. 8 is turned on in the first driver slice 110-1, that is, when the upper bit signal MSB is at a low level, which correspond to a logic 0. This is denoted by the eleventh equivalent resistor R11.

Among the resistors in the left box, the resistance coupled to the second power source VSSQ corresponds to the output impedance when the first NMOS transistor MN of FIG. 8 is turned on in the first driver slice 110-1, that is, when the upper bit signal MSB is at a high level, which corresponds to a logic 1. This is denoted by the twelfth equivalent resistor R12.

In this embodiment, the output impedance is determined considering the first resistor R1 of FIG. 8.

Among the resistors in the right box, the resistance coupled to the first power source VDDQ corresponds to the output impedance when the second PMOS transistor LP of FIG. 9 is turned on in the second driver slice 120-1, that is, when the lower bit signal LSB is at the low level. This is denoted by the 21st equivalent resistor R21.

Among the resistors in the right box, the resistor coupled to the second power supply VSSQ corresponds to the output impedance when the second NMOS transistor LN of FIG. 9 is turned on in the second driver slice 120-1, that is, when the lower bit signal LSB is at the high level. This is denoted by the 22nd equivalent resistor R22.

In this embodiment, the output impedance is a value determined considering the second resistor R2 of FIG. 9.

Also, the number shown next to the resistor indicates the number of equivalent resistors parallelly coupled between the first power supply VDDQ or the second power supply VSSQ and the output node NO. For example, "R12×20" shown in FIG. 12 may indicate that twenty equivalent resistors R12 respectively included in the plurality of first driving circuit slides 110-1 to 110-20 of the first driving circuit 110 are coupled in parallel to each other between the second power supply VSSQ and the output node NO.

In FIGS. 12 to 15, the terminating resistor RT coupled to the output node NO is shown together.

Figure 12:
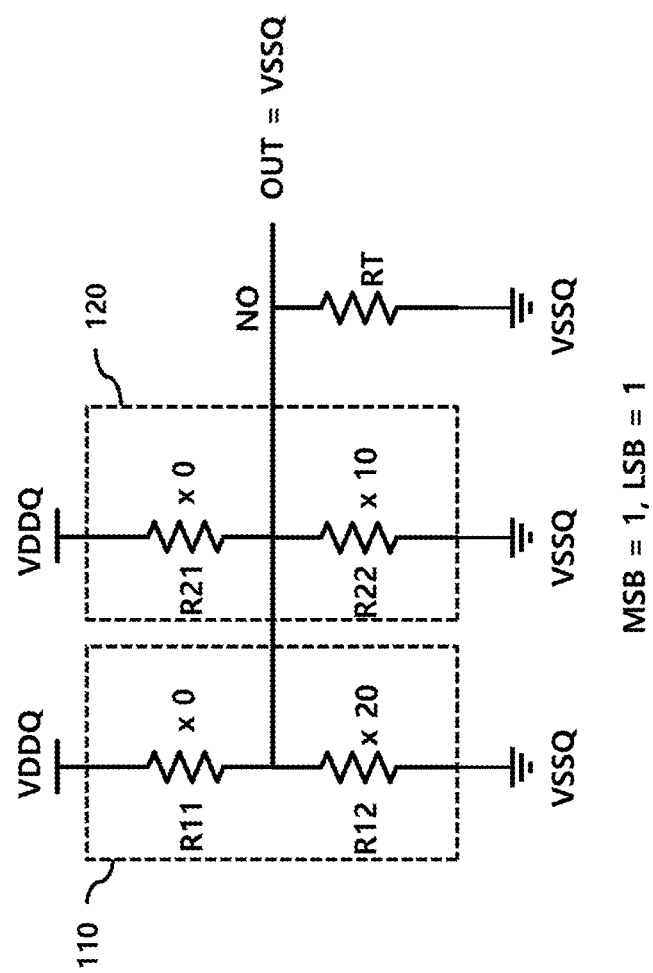
FIGS. 12, 13, 14, and 15 illustrate calibration operations according to an embodiment of the present disclosure.

FIG. 12 corresponds to a case of the upper bit signal MSB has a first value (e.g., a logic high value of 1) and the lower bit signal LSB has a first value (e.g., 1).

At this time, the first PMOS transistor MP and the second PMOS transistor LP are turned off, and the first NMOS transistor MN and the second NMOS transistor LN are turned on.

Accordingly, the 11th equivalent resistor R11 and the 21st equivalent resistor R21 are not coupled to the output node NO, whereas twenty equivalent resistors R12 and ten equivalent resistors R22 are coupled to the output node NO.

In this case, the voltage of the output signal OUT is equal to the voltage of the second power source VSSQ regardless of the resistance values of the 12th equivalent resistors R12 and the 22nd equivalent resistors R22.

Figure 13:
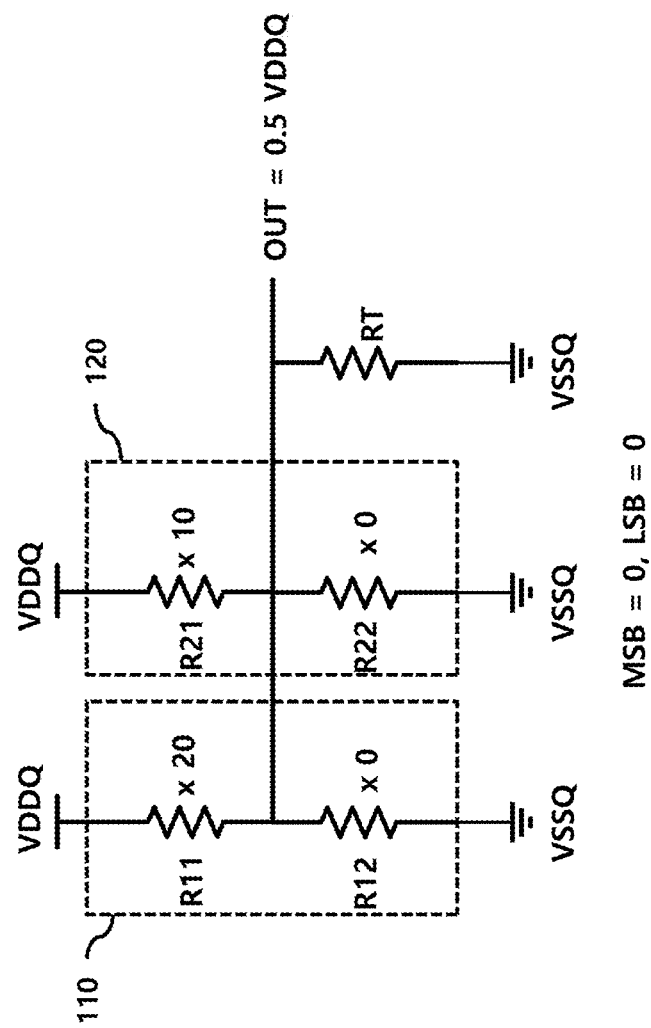

FIG. 13 corresponds to the case of MSB=0 and LSB=0. For example, the upper bit signal MSB has a second value (e.g., a logic low value of 0) and the lower bit signal LSB has a second value.

At this time, the first PMOS transistor MP and the second PMOS transistor LP are turned on, and the first NMOS transistor MN and the second NMOS transistor LN are turned off.

Accordingly, the 12th equivalent resistor R12 and the 22nd equivalent resistor R22 are not coupled to the output node NO, whereas twenty equivalent resistors R11 and ten equivalent resistors R21 are coupled to the output node NO.

In the embodiment of FIG. 13, the voltage of the corresponding output signal OUT is set to be about 0.5 times of the first power supply VDDQ.

Figure 14:
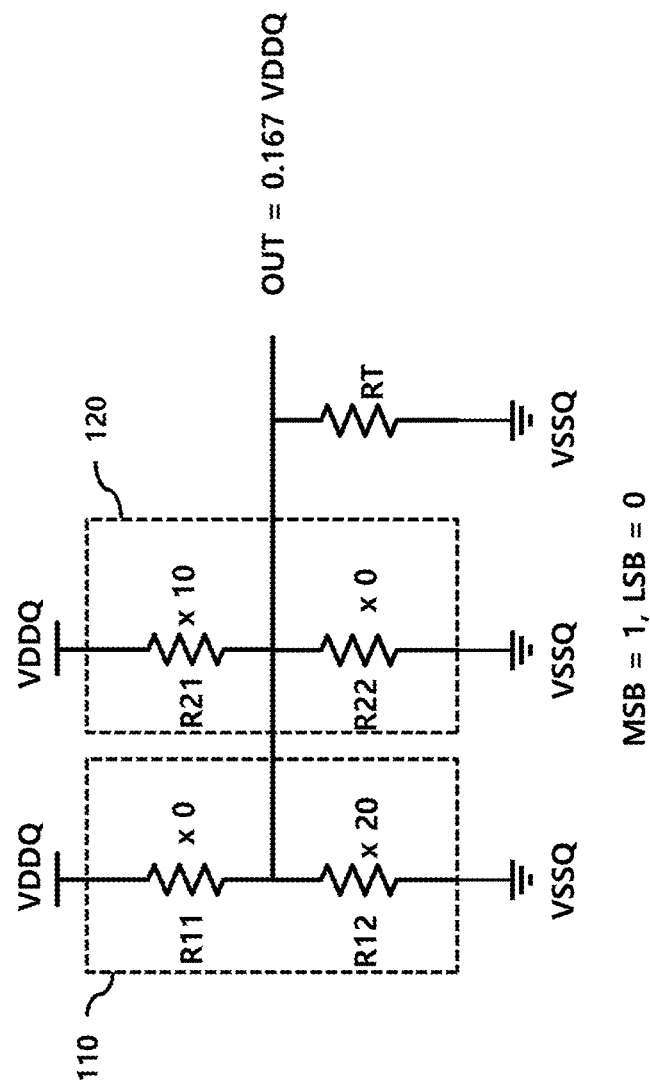

FIG. 14 corresponds to the case of MSB=1 and LSB=0. For example, the upper bit signal MSB has a first value (e.g., a logic high value of 1) and the lower bit signal LSB has a second value (e.g., a logic low value of 0).

At this time, the first NMOS transistor MN and the second PMOS transistor LP are turned on, and the first PMOS transistor MP and the second NMOS transistor LN are turned off.

Accordingly, the 11th equivalent resistor R11 and the 22nd equivalent resistor R22 are not coupled to the output node NO, whereas twenty equivalent resistors R12 and ten equivalent resistors R21 are coupled to the output node NO.

In the embodiment of FIG. 14, the voltage of the corresponding output signal OUT is set to be about 0.167 times the first power VDDQ.

Figure 15:
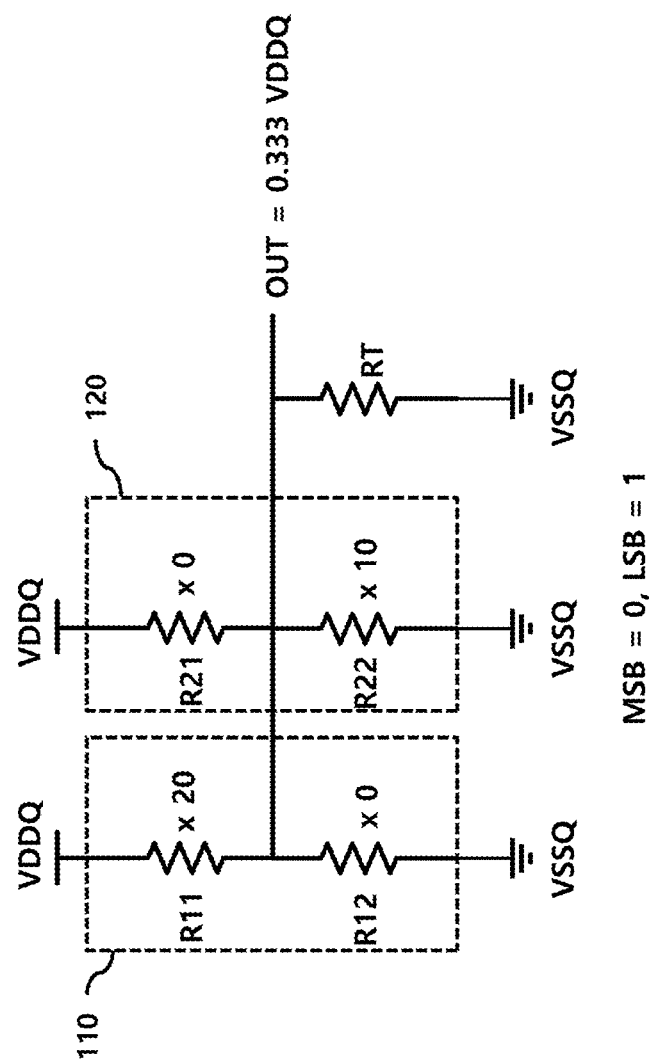

FIG. 15 corresponds to the case of MSB=0 and LSB=1. For example, the upper bit signal MSB has a second value (e.g., a logic low value of 0) and the lower bit signal LSB has a first value (e.g., a logic high value of 1).

At this time, the first PMOS transistor MP and the second NMOS transistor LN are turned on, and the first NMOS transistor MN and the second PMOS transistor LP are turned off.

Accordingly, the 12th equivalent resistor R12 and the 21st equivalent resistor R21 are not coupled to the output node NO, whereas twenty equivalent resistors R11 and ten equivalent resistors R22 are coupled to the output node NO.

In the embodiment of FIG. 15, the voltage of the output signal OUT corresponding thereto is set to have a voltage of about 0.333 times the first power supply VDDQ. As a result, a first interval between a first level (e.g., VSSQ) and a second level (e.g., 0.167*VDDQ) of the output signal OUT may be substantially equal to a second interval between the second level and a third level (e.g., 0.333*VDDQ) of the output signal OUT as well as a third interval between the third level and a fourth level (e.g., e.g., 0.5*VDDQ) of the output signal OUT, thereby addressing non-linearity issues of transmitting a multi-level signal (e.g., PAM-4 signal). In other words, a transmitter according to an embodiment may perform output impedance matching in real time based on received data, thereby ensuing signal integrity of an output signal of the transmitter.

If a condition for determining one or more calibration signals as shown in FIGS. 12 to 15 is given, these calibration signals can be derived by a person skilled in the art through experiment and calculation, and thus a detailed description thereof will be omitted.

The determined calibration signals may be stored in the look-up table 400 as shown in FIG. 12.

Although various embodiments have been described for illustrative purposes, various changes and modifications may be possible.

What is claimed is:

1. A transmitter comprising:
a driving circuitry configured to drive a channel coupled to an output node by controlling an output impedance of a pull-up path, an output impedance of a pull-down path, or both, according to one or more multi-bit data signals, a pull-up control signal, and a pull-down control signal;
a driving control circuit configured to generate the pull-up control signal and the pull-down control signal according to one or more calibration signals and the multi-bit data signals or according to the calibration signals and one or more duplicate multi-bit data signals, the duplicate multi-bit data signals duplicating the multi-bit data signals; and
a look-up table storing values of the calibration signals, wherein the driving circuitry comprises:
a first driving circuit configured to drive the channel according to an upper bit signal of the multi-bit data signals; and
a second driving circuit configured to drive the channel according to a lower bit signal of the multi-bit data signals, and
wherein the first driving circuit and the second driving circuit are commonly coupled to the output node,
wherein the first driving circuit includes a plurality of first driving circuit slices which drive the channel according to the upper bit signal and are commonly coupled to the output node,
wherein the second driving circuit includes a plurality of second driving circuit slices which drive the channel by the lower bit signal and are commonly coupled to the output node, and
wherein a ratio between a first number of the plurality of first driving circuit slices and a second number of the plurality of second driving circuit slices is 2:1.

2. The transmitter of claim 1, wherein one of the plurality of first driving circuit slices includes:
a first PMOS transistor having a gate receiving the upper bit signal, a source coupled to a first power source, and a drain coupled to a first node;
a first NMOS transistor including a gate receiving the upper bit signal, a source coupled to a second power source, and a drain coupled to a second node;
a first adjustment circuit coupled between the first node and a third node and an output impedance thereof is controlled by the pull-up control signal; and
a second adjustment circuit coupled between the second node and the third node and an output impedance thereof is controlled by the pull-down control signal.

3. The transmitter of claim 2, wherein the one of the plurality of first driving circuit slices further includes a first resistor coupled between the third node and the output node.

4. The transmitter of claim 1, wherein one of the plurality of second driving circuit slices includes:
a second PMOS transistor including a gate receiving the lower bit signal, a source coupled to a first power source, and a drain coupled to a fourth node;
a second NMOS transistor including a gate receiving the lower bit signal, a source coupled to a second power source, and a source coupled to a fifth node;
a third adjustment circuit coupled between the fourth node and a sixth node and an output impedance thereof is controlled by the pull-up control signal; and
a fourth adjustment circuit coupled between the fifth node and the sixth node and an output impedance thereof is controlled by the pull-down control signal.

5. The transmitter of claim 4, wherein the one of the plurality of second driving circuit slices further includes a second resistor coupled between the sixth node and the output node.

6. A transmitter comprising:
a driving circuitry configured to drive a channel coupled to an output node by controlling an output impedance of a pull-up path, an output impedance of a pull-down path, or both, according to one or more multi-bit data signals, a pull-up control signal, and a pull-down control signal;
a driving control circuit configured to generate the pull-up control signal and the pull-down control signal according to one or more calibration signals and the multi-bit data signals or according to the calibration signals and one or more duplicate multi-bit data signals, the duplicate multi-bit data signals duplicating the multi-bit data signals; and a look-up table storing values of the calibration signals, wherein the driving circuitry comprises:

a first driving circuit configured to drive the channel according to an upper bit signal of the multi-bit data signals; and a second driving circuit configured to drive the channel according to a lower bit signal of the multi-bit data signals, wherein the first driving circuit and the second driving circuit are commonly coupled to the output node, wherein the driving control circuit includes a plurality of first selection circuits and a plurality of second selection circuits, wherein one of the plurality of first selection circuits selects a corresponding one from the calibration signals according to the multi-bit data signals or the duplicate multi-bit data signals to generate a pull-up control bit signal, and wherein one of the plurality of second selection circuits selects a corresponding one from the calibration signals according to the multi-bit data signals or the duplicate multi-bit data signals to generate a pull-down control bit signal.

7. A transmitter comprising:

a driving circuitry configured to drive a channel coupled to an output node by controlling an output impedance of a pull-up path, an output impedance of a pull-down path, or both, according to one or more multi-bit data signals, a pull-up control signal, and a pull-down control signal;

a driving control circuit configured to generate the pull-up control signal and the pull-down control signal according to one or more calibration signals and the multi-bit data signals or according to the calibration signals and one or more duplicate multi-bit data signals, the duplicate multi-bit data signals duplicating the multi-bit data signals;

a look-up table storing values of the calibration signals;

a data conversion circuit configured to generate parallel data from input data; and a first serialization circuit configured to generate the multi-bit data signals by serializing the parallel data.

8. The transmitter of claim 7, wherein first serialization circuit includes:

a first serializer configured to generate an upper bit signal serialized from the parallel data; and a second serializer configured to generate a lower bit signal serialized from the parallel data.

9. The transmitter of claim 7, further comprising a second serialization circuit configured to generate the duplicate multi-bit data signals by serializing the parallel data.

10. The transmitter of claim 9, wherein the second serialization circuit includes:

a third serializer configured to generate a duplicate upper bit signal serialized from the parallel data; and a fourth serializer configured to generate a duplicate lower bit signal serialized from the parallel data.

11. A transmitter comprising:

a driving circuitry configured to drive a channel coupled to an output node by controlling an output impedance of a pull-up path, or an output impedance of a pull-down path, or both, according to one or more multi-bit data signals, a pull-up control signal, and a pull-down control signal;

a driving control circuit configured to generate the pull-up control signal and the pull-down control signal according to one or more calibration signals and one or more duplicate multi-bit data signals, the duplicate multi-bit data signals duplicating the multi-bit data signals;

a data conversion circuit configured to generate parallel data from input data; and a serialization circuitry configured to generate the multi-bit data signals and the duplicate multi-bit data signals by serializing the parallel data.

12. The transmitter of claim 11, further comprising a look-up table storing values of the calibration signals.

13. The transmitter of claim 11, wherein the serialization circuitry includes a first serialization circuit generating the multi-bit data signals by serializing the parallel data and a second serialization circuit generating the duplicate multi-bit data signals by serializing the parallel data.

14. The transmitter of claim 13, wherein the first serialization circuit includes:

a first serializer configured to generate an upper bit signal serialized from the parallel data; and a second serializer configured to generate a lower bit signal serialized from the parallel data, and wherein the second serialization circuit includes:

a third serializer configured to generate a duplicate upper bit signal serialized from the parallel data; and a fourth serializer configured to generate a duplicate lower bit signal serialized from the parallel data.

15. The transmitter of claim 11, wherein the driving circuitry includes:

a first driving circuit configured to drive the channel according to an upper bit signal of the multi-bit data signals; and a second driving circuits configured to drive the channel according to a lower bit signal of the multi-bit data signals, and wherein the first driving circuit and the second driving circuit are commonly coupled to the output node.

16. The transmitter of claim 15, wherein the first driving circuit includes a plurality of first driving circuit slices which drive the channel according to the upper bit signal and are commonly coupled to the output node, and wherein the second driving circuit includes a plurality of second driving circuit slices which drive the channel according to the lower bit signal and are commonly coupled to the output node.

17. The transmitter of claim 15, wherein the driving control circuit includes a plurality of first selection circuits and a plurality of second selection circuits, wherein one of the plurality of first selection circuits selects a corresponding one from the calibration signals according to the multi-bit data signals or the duplicate multi-bit data signals to generate a pull-up control bit signal, and wherein one of the plurality of second selection circuits selects a corresponding one from the calibration signals according to the multi-bit data signals or the duplicate multi-bit data to generate a pull-down control bit signal.

* * * * *